United States Patent
Kamran et al.

(10) Patent No.: US 12,458,243 B2
(45) Date of Patent: Nov. 4, 2025

(54) BIO-IMPEDANCE MEASUREMENT USING VOLTAGE TO CURRENT CONVERSION

(71) Applicant: NXP B.V., Eindhoven (NL)

(72) Inventors: Muhammad Kamran, Helmond (NL); Harry Neuteboom, Eindhoven (NL); Costantino Ligouras, Utrecht (NL); Sergio Andrés Rueda Gómez, Eindhoven (NL); Dave Sebastiaan Kroekenstoel, Eindhoven (NL); Rinze Ida Mechtildis Peter Meijer, Herkenbosch (NL)

(73) Assignee: NXP B.V., Eindhoven (NL)

(*) Notice: Subject to any disclaimer, the term of this patent is extended or adjusted under 35 U.S.C. 154(b) by 1030 days.

(21) Appl. No.: 17/523,766

(22) Filed: Nov. 10, 2021

(65) Prior Publication Data

US 2023/0145384 A1    May 11, 2023

(51) Int. Cl.
*A61B 5/053* (2021.01)
*A61B 5/30* (2021.01)
(Continued)

(52) U.S. Cl.
CPC ............ *A61B 5/053* (2013.01); *A61B 5/30* (2021.01); *H03F 1/342* (2013.01); *H03M 3/40* (2013.01);
(Continued)

(58) Field of Classification Search
CPC ......... A61B 5/053; A61B 5/30; A61B 5/7225; A61B 5/0531; A61B 5/7203; H03F 1/342;
(Continued)

(56) References Cited

U.S. PATENT DOCUMENTS 8,836,345 B2 * 9/2014 Chetham ............. A61B 5/7203
600/509
8,914,099 B2 12/2014 Yazicioglu et al.
(Continued)

FOREIGN PATENT DOCUMENTS

| CN | 109873614 A | 6/2019 |
|---|---|---|
| EP | 3141898 A1 | 3/2017 |
| WO | WO-0028892 A1 | 5/2000 |

OTHER PUBLICATIONS

U.S. Appl. No. 17/553,274, filed Dec. 16, 2021, entitled: Reconfigurable Architecture Analog Front End for Electrochemical Sensors, 41 pgs.
(Continued)

*Primary Examiner* — Giovanni Astacio-Oquendo

(57) ABSTRACT

A method and apparatus are described for bio-impedance measurement using voltage to current conversion. In one example, a bio-impedance transducer includes an input stage to receive a bio-impedance signal having an oscillating voltage from two electrodes, the electrodes being coupled to a body, a resistance across the two electrodes to determine an alternating current of the bio-impedance signal, a gain stage coupled to the resistance to amplify the alternating current, a down converter coupled to the gain stage to convert the amplified alternating current to a direct current bio-impedance signal, and an analog-to-digital converter coupled to the down converter to convert the direct current bio-impedance signal to a digital bio-impedance signal.

20 Claims, 7 Drawing Sheets

(51) Int. Cl.
*H03F 1/34* (2006.01)
*H03M 3/00* (2006.01)
*H04L 67/12* (2022.01)

(52) U.S. Cl.
CPC ........ *H04L 67/12* (2013.01); *H03F 2200/261* (2013.01)

(58) Field of Classification Search
CPC ..... H03F 2200/261; H03M 3/40; H03M 1/12; H04L 67/12; G01R 27/02; G01R 27/08; H03D 7/12; H03G 3/30
USPC ...................................... 324/600, 76.11, 549
See application file for complete search history.

(56) References Cited

U.S. PATENT DOCUMENTS

| | | | |
|---|---|---|---|
| 9,294,048 | B2 | 3/2016 | Van Helleputte et al. |
| 9,839,370 | B2 | 12/2017 | Chételat |
| 11,918,377 | B2 * | 3/2024 | Cao ...................... A61B 5/7207 |
| 2012/0095361 | A1 | 4/2012 | Xu et al. |
| 2013/0116577 | A1 * | 5/2013 | Yazicioglu ............. A61B 5/346 600/483 |
| 2018/0035907 | A1 * | 2/2018 | Park ...................... A61B 5/7203 |
| 2019/0387997 | A1 * | 12/2019 | Franck ................... A61B 5/282 |
| 2020/0253500 | A1 | 8/2020 | Ha et al. |
| 2021/0059606 | A1 * | 3/2021 | Kim ...................... A61B 5/0538 |

OTHER PUBLICATIONS

Ko, Hyoungho et al.; "Ultralow-Power Bioimpedance IC With Intermediate Frequency Shifting Chopper"; IEEE Transactions on Circuits and Systems—II: Express Briefs, vol. 63, No. 3, Mar. 2016; 5 pages.

Yazicioglu, Refet Firat et al.; "A 60 μ W 60 n V / Hz Readout Front-End for Portable Biopotential Acquisition Systems"; IEEE Journal of Solid-State Circuits, vol. 42, No. 5, May 2007; 11 pages.

* cited by examiner

BIO-IMPEDANCE MEASUREMENT USING VOLTAGE TO CURRENT CONVERSION

BACKGROUND

Remote and personal health care monitoring is a growing market with new and improved devices being produced. Wearable fitness trackers measure heartbeats, distance traveled, steps and other impact events. New sensors are being developed to support glucose monitoring, blood oxygen levels and other vital signs that can be measured directly or inferred from other sensors. These sensors are combined with wireless interfaces such as Bluetooth, Wi-Fi, and cellular to provide continuous data reports to the patient and health care professionals for In-Patient and Out-Patient monitoring.

The Internet-of-Things (IoT) offers low cost, low power, low data rate communications with a wide range of devices on external networks. IoT has generated particular excitement in healthcare because of its singular potential to improve the health, safety, and quality of life for people everywhere. The semiconductor content in clinical-grade smart IoT edge healthcare devices provides smart processing, analysis, and reporting of many different vital signs.

Bio-impedance is suggested as a measurement for a variety of different body parameters. One use of bio-impedance is as a part of an electrocardiogram (ECG) patch. The patch is provided as a self-contained small flat device that can be attached to the body with an adhesive much like a self-adhesive bandage. For bio-impedance, an ECG patch uses dry electrodes that are directly applied to or connected to the body skin. A signal is applied across the electrodes and the impedance to the signal is measured.

SUMMARY

A method and apparatus are described for bio-impedance measurement using voltage to current conversion. In one example, a bio-impedance transducer includes an input stage to receive a bio-impedance signal having an oscillating voltage from two electrodes, the electrodes being coupled to a body, a resistance across the two electrodes to determine an alternating current of the bio-impedance signal, a gain stage coupled to the resistance to amplify the alternating current, a down converter coupled to the gain stage to convert the amplified alternating current to a direct current bio-impedance signal, and an analog-to-digital converter coupled to the gain stage to convert the direct current bio-impedance signal to a digital bio-impedance signal.

In some embodiments, the input stage comprises a source-follower circuit coupled to the electrodes at a first input and coupled to the resistance at a first output. In some embodiment, the input stage comprises a feedback loop coupled across the electrodes and to the gain stage. In some embodiments, the feedback loop includes a balanced operational transconductance amplifier. In some embodiments, the feedback loop includes diode-connected transistors between the electrodes and the gain stage.

Some embodiments include an excitation current source coupled to the electrodes to generate an alternating current excitation current to be injected into the body through the electrodes. In some embodiments, the down converter comprises a mixer to mix the amplified alternating current with the excitation current. In some embodiments, the analog-to-digital converter comprises a continuous time sigma delta analog-to-digital converter.

In some embodiments, the continuous time sigma delta analog-to-digital converter comprises a balanced operational transconductance amplifier coupled to the amplified alternating current as an input and a capacitor coupled across the input and an output of the balanced operational transconductance amplifier.

In some embodiments, the gain stage further includes an in-phase gain stage coupled to the resistance to amplify an in-phase component of the alternating current, and a quadrature phase gain stage coupled to the resistance to amplify a quadrature phase component of the alternating current.

In some embodiments, the down converter further includes an in-phase down converter coupled to the in-phase gain stage to convert the amplified in-phase component to a direct current in-phase bio-impedance signal, and a quadrature phase down converter coupled to the quadrature phase gain stage to convert the amplified quadrature phase component to a direct current quadrature phase bio-impedance signal In some embodiments, the analog-to-digital converter further includes an in-phase analog-to-digital converter coupled to the in-phase gain stage to convert the direct current in-phase bio-impedance signal to a digital in-phase bio-impedance signal, and a quadrature phase analog-to-digital converter coupled to the quadrature phase down converter to convert the direct current quadrature phase bio-impedance signal to a digital quadrature phase bio-impedance signal;

Some embodiments further include a current mirror coupled to the down converter to convert a differential current from the down converter to a single ended current to the analog-to-digital converter.

In an embodiment, a method includes receiving a bio-impedance signal at an input stage, bio-impedance signal having an oscillating voltage from two electrodes, the electrodes being coupled to a body, determining an alternating current of the bio-impedance signal through a resistance coupled across the two electrodes, amplifying the alternating current, converting the amplified alternating current to a direct current bio-impedance signal, and converting the direct current bio-impedance signal to a digital bio-impedance signal.

Some embodiments further include feeding back the input stage signal across the electrodes to the amplifying of the alternating current. Some embodiments further include generating an alternating current excitation current, and injecting the excitation current into the body through the electrodes.

In some embodiments, converting comprises mixing the amplified alternating current with the excitation current.

In an embodiment, a health monitor system includes an input stage to receive a bio-impedance signal having an oscillating voltage from two electrodes, the electrodes being coupled to a body, a resistance across the two electrodes to determine an alternating current of the bio-impedance signal, a gain stage coupled to the resistance to amplify the alternating current, a down converter coupled to the gain stage to convert the amplified alternating current to a direct current bio-impedance signal, an analog-to-digital converter coupled to the down converter to convert the direct current bio-impedance signal to a digital bio-impedance signal, and a radio frequency system to send the digital bio-impedance signal to external components.

In some embodiments, the input stage is based on a current balancing instrumentation amplifier such that the oscillating voltage from the electrodes appears on the resistance through a source follower input stage. In some embodiments, the input stage is coupled directly to the gain stage with no intermediate stage.

DETAILED DESCRIPTION

Figure 1:
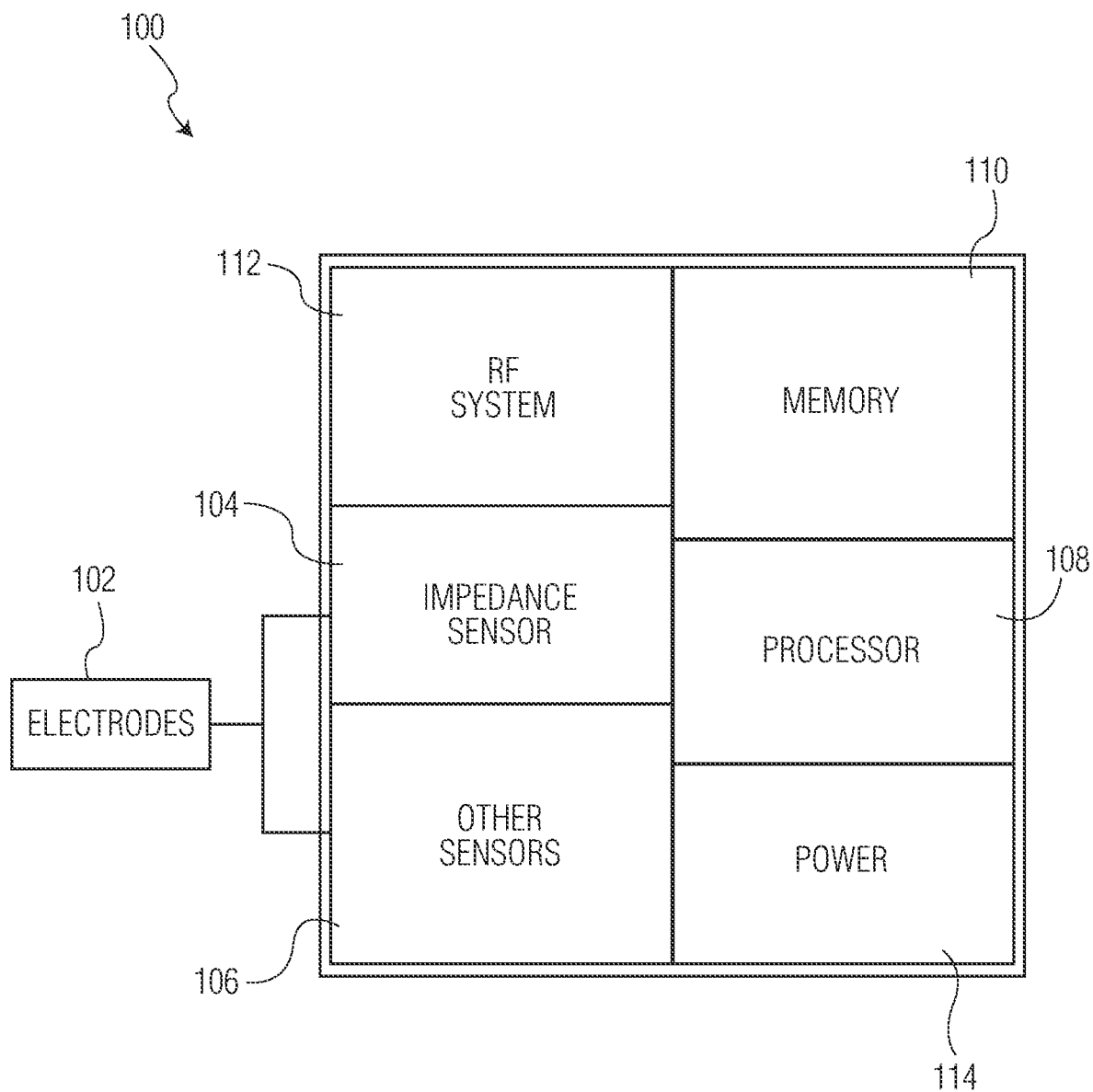
FIG. 1 is a block diagram of a system for measuring parameters of a body.

It will be readily understood that the components of the embodiments as generally described herein and illustrated in the appended drawings could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

A power efficient bio impedance measurement device and method are described herein. The bio-impedance measurement may be used for any of a wide variety of different purposes. The measurement device is described as being incorporated into a patch but may also be used with and for other devices and for in-patient and out-patient monitoring. The described implementation may be part of a complete vital signs analog front end (AFE) for an Internet of things (IoT) or other connected device.

Electrodes on a human body tend to pick up noise and interference that the body has received from external electrical and magnetic sources. Common mode noise is a particularly large component of the noise and is received from alternating current (AC) power systems, i.e., AC mains power, such as lamps, motors, wiring, etc. The electrodes not only pick up the desired impedance signal but also pick up the noise. The described analog front end amplifier has a very high common mode rejection and is able to measure the desired signal with low noise. Efficiency is improved by providing a current signal as an input to a continuous time sigma delta analog-to-digital converter (ADC) instead of a voltage signal into a voltage input ADC. The continuous time sigma delta ADC also eliminates any requirement for an anti-aliasing filter.

FIG. 1 is a block diagram of a health monitoring system such as a smart patch or other system for measuring parameters of a body. The form factor may be modified to suit different purposes and uses. In some embodiments, the system 100 is 20-40 mm wide and long and less than 5 mm thick with an adhesive strip on one side to attach to the human body in an appropriate place. A strap or band (not shown) may be provided to wrap around an arm or other body part to hold the system 100 in place. The system 100 may have a housing that is moisture and impact resistant with an access port to allow service to batteries and other components.

The health monitoring system 100 has one or more sets of electrodes 102 to make electrical contact with the human body. The electrodes 102 are coupled to an impedance sensor 104 referred to as a bio-impedance sensor for measuring an impedance across the electrodes when the electrodes are electrically coupled to the body. The impedance sensor 104 is coupled to a processor 108 for processing the measured impedance for controlling an applied signal across the electrodes and for controlling other components of the system.

The electrodes 102 are further optionally coupled to other sensors 106 to measure other vital signs or parameters of the body or the surrounding environment. The other sensors 106 may include environmental temperature, pressure, humidity, and any suitable body parameters. The same electrodes or other electrodes may be used, depending on the particular implementation. The other sensors 106 are further coupled to the processor 108 to provide data which the processor may use and communicate in any suitable way. The processor is coupled to a memory 110 to store data from the sensors and other values determined by the processor or received from other components.

The processor and memory are further coupled to a radio frequency (RF) system 112 that provides communication to external components that may include network nodes, a user interface, and further sensors. In one use example, the system 100 communicates with a smart phone (not shown) through an RF interface to provide information to the user and may also send information to a health monitoring facility. In another use example, the system communicates with a cellular or Wi-Fi network node to send information directly to a health care facility. The health care facility may then provide alerts to the user through any desired means. The RF interface may use one or more wireless communications system and protocols including near field communication, Bluetooth, Wi-Fi and cellular. Each of the components are also coupled directly or indirectly to a power supply 114 which may be in the form of a battery, a solar cell, a kinetic energy harvester, a thermal energy harvester or any other suitable power source or combination of sources.

The system 100 may be in the form of a single integrated circuit (IC) or some of the components may be combined while other components are not. The multiple components may be combined into a single package for example as a multi-chip module (MCM) or system in a package (SiP) or other physical implementation. Additional components may be added to the system 100 and fewer components may be used. Some functions may be provided on different modules than as described herein. More or fewer modules may be provided than as shown herein.

Figure 2:
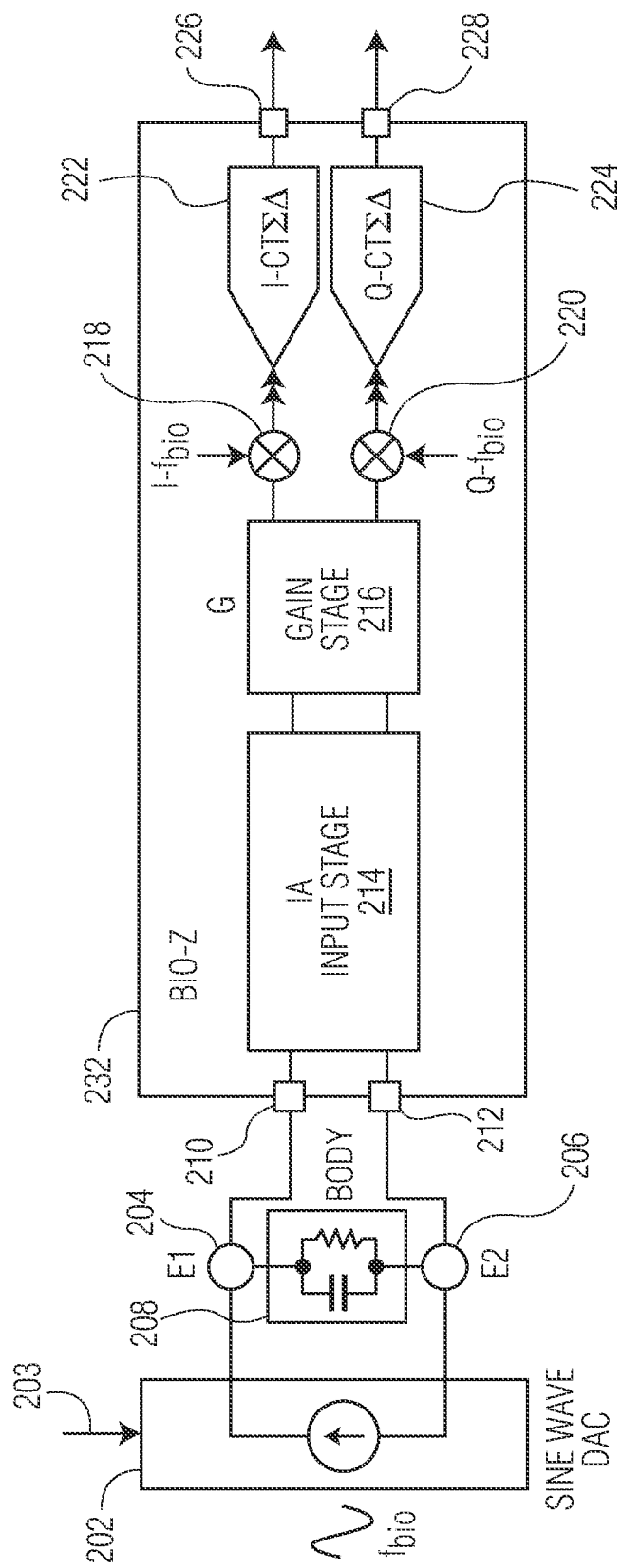
FIG. 2 is a block diagram of a bio-impedance sensor.

FIG. 2 is a block diagram of a bio-impedance sensor 200 such as that of FIG. 1 or for use in a different system. The bio-impedance sensor 200 includes or is connected to an excitation current source 202, which may be a part of the bio-impedance sensor or a separate component as shown. The excitation current source 202 includes a current digital to analog converter (DAC) that generates an excitation current, identified as $f_{bio}$, as an alternating current (AC). The amplitude of the AC excitation current may have a variety of different amplitude values as determined by an external control input 203. The control input 203 may be a digital value applied to the DAC to suit different uses for the bio-impedance measurement. The current is injected into the body 208 through electrodes 204, 206. The body 208 is difficult to characterize electrically due to its complexity and variability under external and internal factors. It presents an impedance to an applied voltage. The current generates a potential through the body across the electrodes. The voltage is measured by a bio-impedance channel in the bio-impedance sensor 200.

The electrodes 204, 206 are coupled to respective input ports 210, 212 of a bio-impedance transducer 232. The bio-impedance transducer 232 converts the received voltage at its input ports 210, 212 to a digital value at its outputs 226, 228. The bio-impedance transducer has an input stage 214 which provides a high input impedance to receive the voltage through the body 208 at very low current. A gain stage 216 amplifies the signal. A first mixer 218 and a second mixer 220 mix the amplified signal with the excitation current frequency to down convert the impedance signal as a current. The first mixer 218 receives an in-phase excitation signal to mix with the amplified signal to generate an in-phase (I) output. The second mixer 220 receives a quadrature phase excitation signal to generate a quadrature phase (Q) output. The impedance signal is coupled to analog-to-digital converters (ADC) 222, 224 to generate respective I and Q numerical values to represent the body impedance as indicated by the voltage received from the electrodes 204, 206. In some embodiments, the gain stage converts the received voltage to a current and a current is applied to the ADCs. The ADCs may be in the form of continuous time sigma-delta (CTΣΔ) ADCs.

Figure 3:
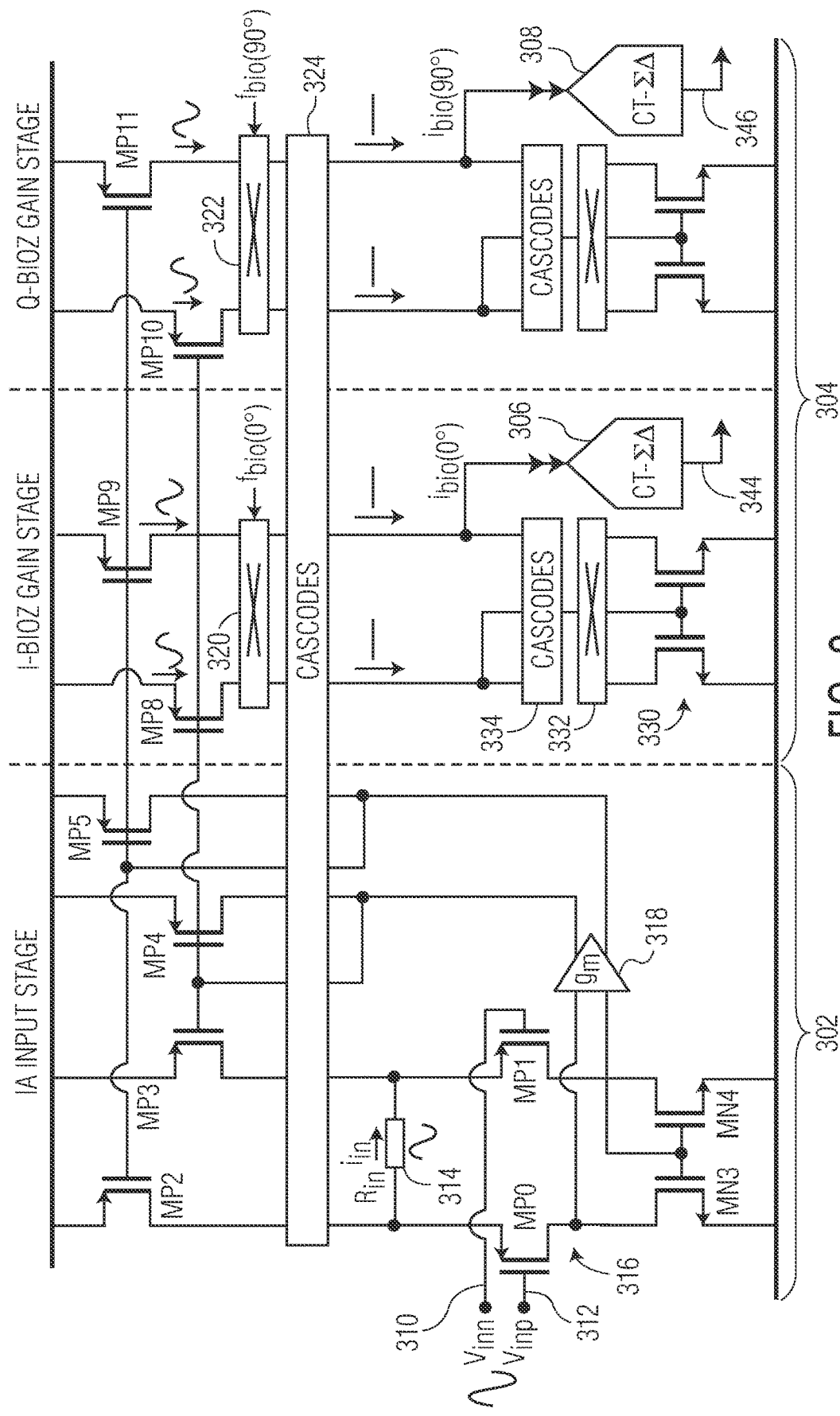
FIG. 3 is circuit diagram of portions of a bio-impedance transducer.

FIG. 3 is a circuit diagram of portions of the bio-impedance transducer 232 of FIG. 2 including the input stage, and gain stage. An input stage 302 receives the oscillating voltage from the electrodes at an n input 310 and a p input 312. The n input 310 and the p input are applied to a source-follower input stage 316 including transistor MP0 and MP1. The voltage between the two branches of the input stage is applied across a resistor 314, labeled Rin, to generate the input current, Iin, across the resistor 314. As shown, while the input is an oscillating voltage across the n input 310 and the p input 312, the signal across the resistor 314 is an alternating current. The differential input voltage produces the current in the resistor 314, so that the input stage produces a very high common mode rejection.

The current produced in the resistor 314 is copied via a feedback loop across the n input 310 and the p input 312 through a gm stage 318 and two diode-connected P-type Metal Oxide Semiconductor (PMOS) transistors MP4 and MP5. The feedback loop is used for biasing and also to couple out the current. This configuration consumes very little current for the feedback loop. The gm stage may be implemented using a balanced operational transconductance amplifier with one or more stages or using any other suitable transconductance stage, including differential stages. Other types of amplifier architectures may be used instead or in addition. It may be formed using differential amplifiers, cascodes, or other components.

The alternating current flowing through the diode connected PMOS transistors MP4 and MP5 is copied to the gain stage via current mirrors. The ratio of these current mirror transistors determines the gain of the amplifier. A first current mirror is formed in the gain stage 304 by transistors MP8 and MP10 coupled to input stage transistor MP3 through diode-connected transistor MP4. A second current mirror is formed in the gain stage 304 by transistors MP9 and MP11 coupled to input stage transistor MP2 through the diode-connected transistor MP5.

The gain stage has differential alternating current outputs and the first output is provided to an in-phase mixer 320 to be down converted using the excitation signal fbio (0°). The second output is provided to a quadrature phase mixer 322 to be down converted using an orthogonal complement of the excitation signal fbio (90°). The bio-impedance measurements from the electrodes have both real and imaginary parts. The I-Q mixer formed of the in-phase mixer 320 and quadrature phase mixer 322 is used in the current domain which simplifies down conversion performed by the I-Q mixer.

The outputs of the down conversion from the in-phase mixer 320 and the quadrature phase mixer 322 are current outputs at direct current (DC) which are each fed to a respective 2nd order CTΣΔ ADC, namely an I ADC 306 and a Q ADC 308, optionally through cascodes 324. The resulting quantified I-Q result with an I digital output 344 from the I ADC 306 and a Q digital output 346 from the Q ADC 308 is then provided to e.g., the processor for further analysis, storage, communication, and other functions.

As shown, the circuit of FIG. 3 generates an I digital output 344 and a Q digital output 346 without any need for any intermediate gain stage. Eliminating the intermediate gain stage improves power efficiency which may be important for a smart patch or remote monitoring implementation. The gain stage is closely linked to the mixing stage and the combination provides a high common mode rejection ratio (CMRR). The CMRR of the transducer is affected by the precision of the matching at the input stage. This matching may be improved further at the input stage by chopping the input signal to an intermediate frequency and adding that frequency to the down conversion.

A current mirror 330, in this case an N-type Metal Oxide Semiconductor (NMOS) current mirror, is coupled below the CTΣΔ ADC 306 input to convert the differential current from the in-phase mixer 320 serving as a down converter to a single ended current that is measured by the CTΣΔ ADC 306. The current mirror 330 is coupled to the differential output of the in-phase mixer 320. The CTΣΔ ADC 306 is coupled to a single node between the in-phase mixer 320 and the current mirror. A mixer 332 coupled above the current mirror 330 improves the matching of the input current with the current mirror 330. Cascodes 324, 334 are coupled to either side of the CTΣΔ ADC input to increase the output impedance of the current mirror 330. The particular circuit illustrated in FIG. 2 and the other figures may be modified to suit cost, form factor, precision, and other constraints. Elements may be substituted with other equivalent elements to suit different implementation.

Figure 4:
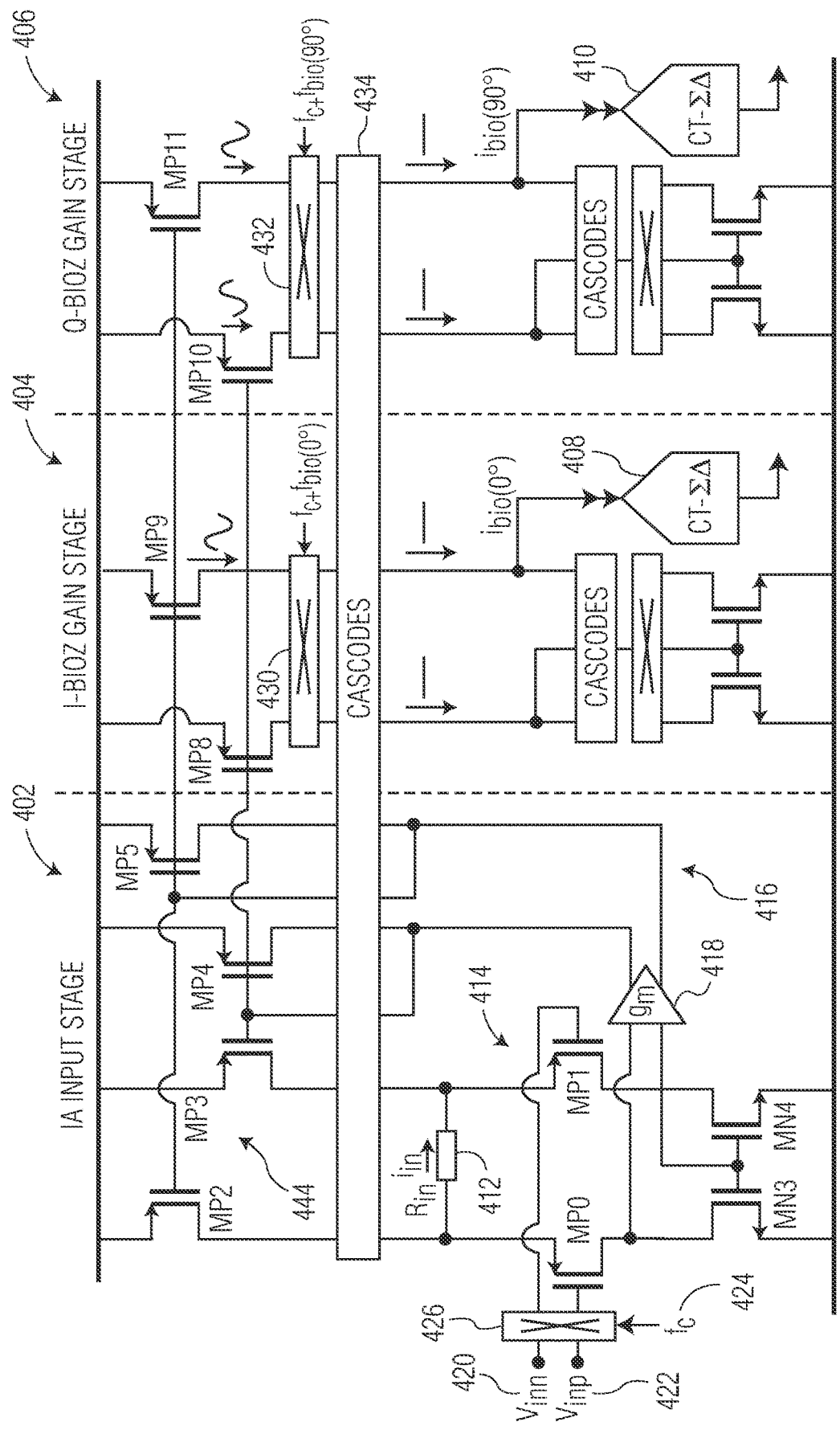
FIG. 4 is a circuit diagram of portions of an alternative bio-impedance transducer.

FIG. 4 is a circuit diagram of portions of the bio-impedance transducer 232 of FIG. 2 in an alternative embodiment in which a chopping mixer is used at the input stage. From the electrodes, a first bio-impedance signal is received as an oscillating voltage, Vin n, and a second bio-impedance signal is received as a complementary oscillating voltage, Vin p. The received bio-impedance signal has a frequency that is determined by the excitation current applied from the excitation current source 202 as shown in FIG. 2. The bio-impedance signals are applied to a mixer 426 to mix with a chopping frequency, fc, 424 to down convert the bio-impedance signals. The down conversion allows process variations in input source-follower circuits 414 that receive the bio-impedance signals, to be averaged over time. This may allow for higher precision in measuring the impedance of the bio-impedance signal.

The input source-follower circuits 414 are coupled across a resistance 412, such as a resistor, to the down converted bio-impedance signals. The input source-follower circuits 414 are coupled to current mirrors 444 that couple the bio-impedance signal over to gain stages 404, 406. The input source-follower circuits 414 are also coupled to a feedback loop 416, through a gm stage 418 and transistor diodes MP4, MP5, to the gate nodes of the current mirrors. Except for the initial chop mixer 426, a chop frequency down mixer, this is the same configuration described above with respect to FIG. 3.

At the gain stages, the in-phase component is amplified, down converted, and converted to digital separately from the quadrature component. The two components may be recombined as differential digital components of the bio-impedance signals for further processing and storage. The in-phase gain stage 404 has gain amplifiers MP8, MP9 that couple the in-phase component into a down converter 430. The down converter uses an input frequency that combines the chop frequency, fc, with the in-phase excitation current frequency fbio(0°). The resulting DC signal, ibio(0°), is provided to a current input ADC 408, e.g., a CTΣΔ ADC. In a similar way, the quadrature phase gain stage 404 has gain amplifiers MP10, MP11 that couple the quadrature phase component into a down converter 432. The down converter uses an input frequency that combines the chop frequency, fc, with the quadrature phase excitation current frequency fbio(90°). The resulting DC signal, ibio(90°), is provided to a current input ADC 410, e.g., a CTΣΔ ADC. By adding the chop frequency, fc, to the excitation current frequency, the effect of the initial chop mixer 426 is compensated for and the ADC outputs are the same or similar to that of FIG. 2, but with less distortion due to any imprecision in the input stage 402. Except for using the chop frequency in the down converters 430, 432, the gain stages and the CTΣΔ ADCs have the same configuration described above with respect to FIG. 3.

Figure 5:
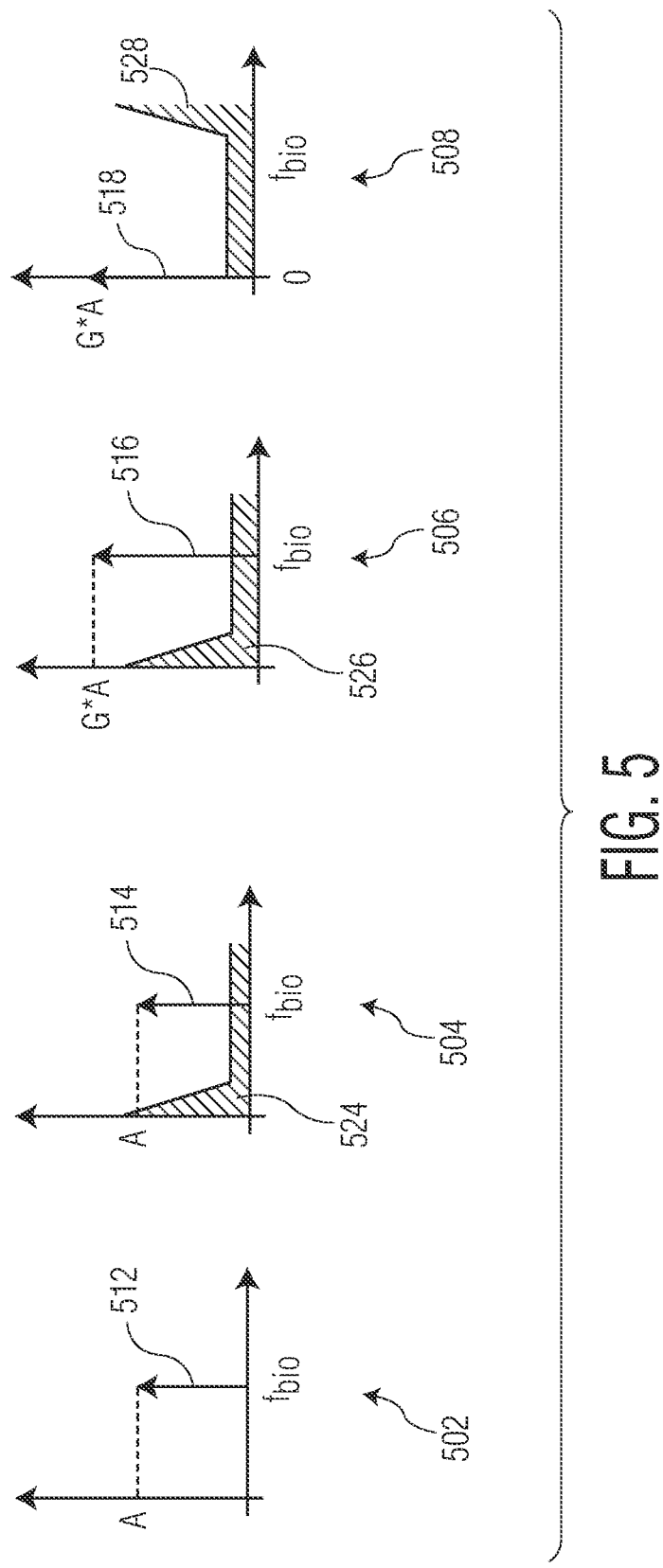
FIG. 5 is a sequence of graphs of different stages of a bio-impedance signal aligned on the horizontal axis as it is modified through a bio-impedance transducer.

FIG. 5 is a sequence of graphs of different stages of the bio-impedance signal aligned on the horizontal axis as it is modified through the bio-impedance transducer 232. At 502 a signal fbio has an amplitude of A in amperage from zero on the vertical axis. This signal, fbio, represents the absolute value of the amplitude of the alternating voltage signal applied to the body 208 from the excitation current source 202 by the electrodes 204, 206.

At 504, the signal has been received through the input stage 214 and coupled to the gain stage 216. The signal still has an amplitude of A in amperes. Noise 524 has been added to the signal through the body and the input stage which may include common mode noise and other noise introduced by the circuits.

At 506, the signal is amplified through the gain stage before being down converted and the amplitude is now G*A above zero on the vertical axis. The noise 526, of the input stage is also amplified with the same gain factor The signal amplitude 516 is shown higher. At 508, the signal 518 is a DC signal from the first mixer 218 and the second mixer 220, which act as downconverters, and is shifted with respect to the noise 528. The noise 528 is primarily flicker noise. Due to the mixing operation, the flicker noise is moved to higher frequencies at the right side of the graphs as shown in 508.

Figure 6:
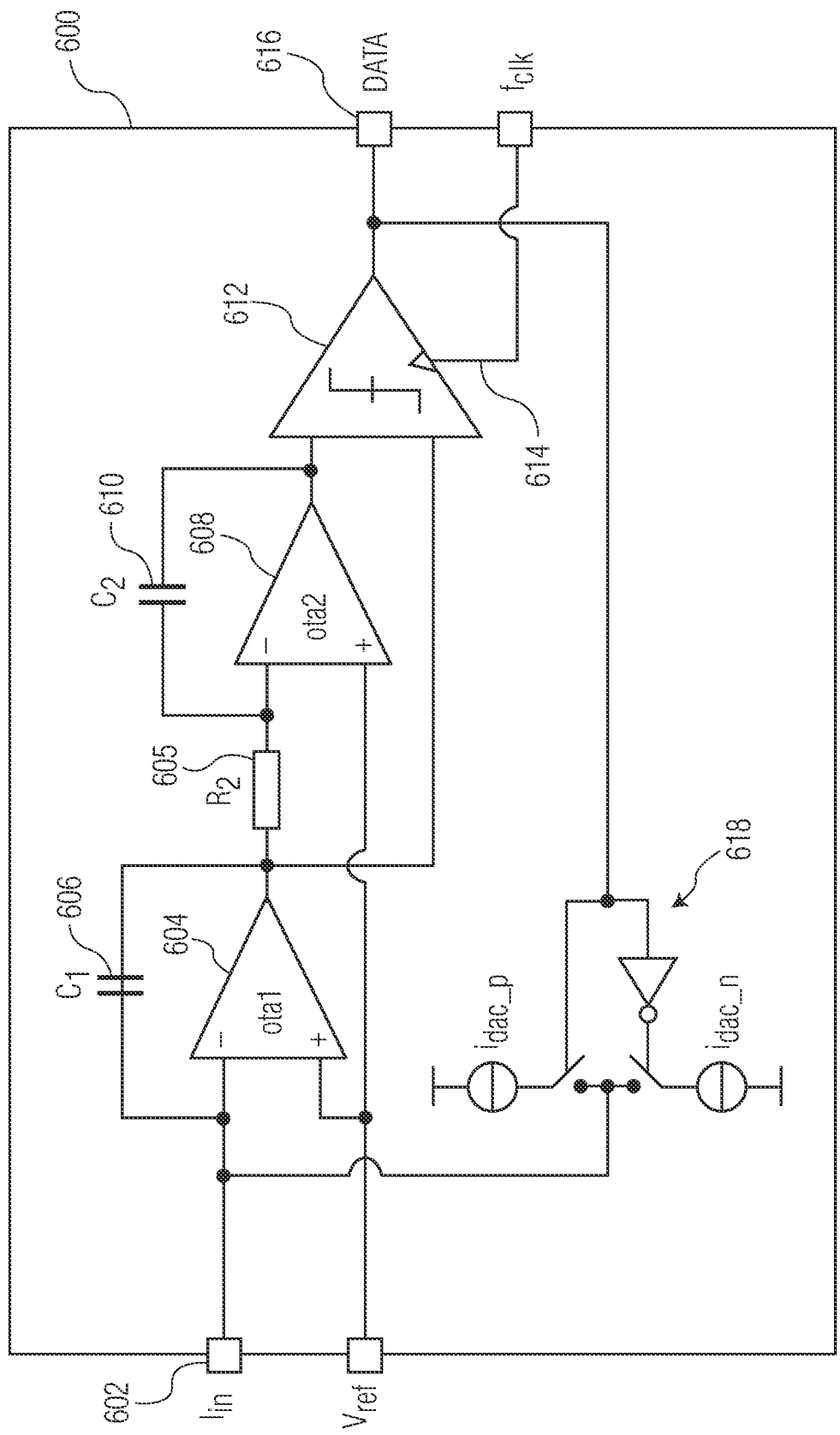
FIG. 6 is a simplified circuit diagram of a continuous time current input second order sigma delta analog-to-digital converter.

FIG. 6 is a simplified circuit diagram of a current input second order continuous time sigma delta ADC suitable for use with the described embodiments. A CTΣΔ ADC filters out-of-band signals to virtually eliminate them. It also eliminates any requirement for an anti-aliasing filter. The input signal, Iin, whether the in-phase component or the quadrature phase component is received at an input port 602 of the ADC 600. The input signal, Iin, is applied as an input to a first OTA 604 together with a reference voltage, Vref, input. The output is applied through a resistance 605 as an input to a second OTA 608 together with the same reference voltage, Vref.

A first capacitance 606 is coupled across the input to the first OTA 604 and the output of the first OTA 604 in the form of a capacitor. A second capacitance 610 is coupled across the input to the second OTA 608 and the output of the second OTA 608 in the form of a second capacitor. The capacitances 606, 610 absorb and discharge the input current as it is received so that the ADC can operate using a current input and not be subject to the noise of a resistance in a voltage input ADC. This allows for a more precise bio-impedance measurement result.

The ADC 600 further includes a latched comparator 612 that operates on an input clock, fclk, 614 to generate a digital data result on an output port 616. A 1-bit DAC 618 is connected to the output port 616 and the input port 602 as a feedback loop. There may also be filters, interpolators, and a variety of other components to the ADC 600 (not shown). The described configuration is provided as an example and any of a variety of other ADCs may be used instead.

Embodiments as described herein provide for bio-impedance measurement using a very high CMRR input amplifier stage, for converting the voltage to current and for using a CTΣΔ ADC which also eliminates a requirement for an anti-aliasing filter.

Figure 7:
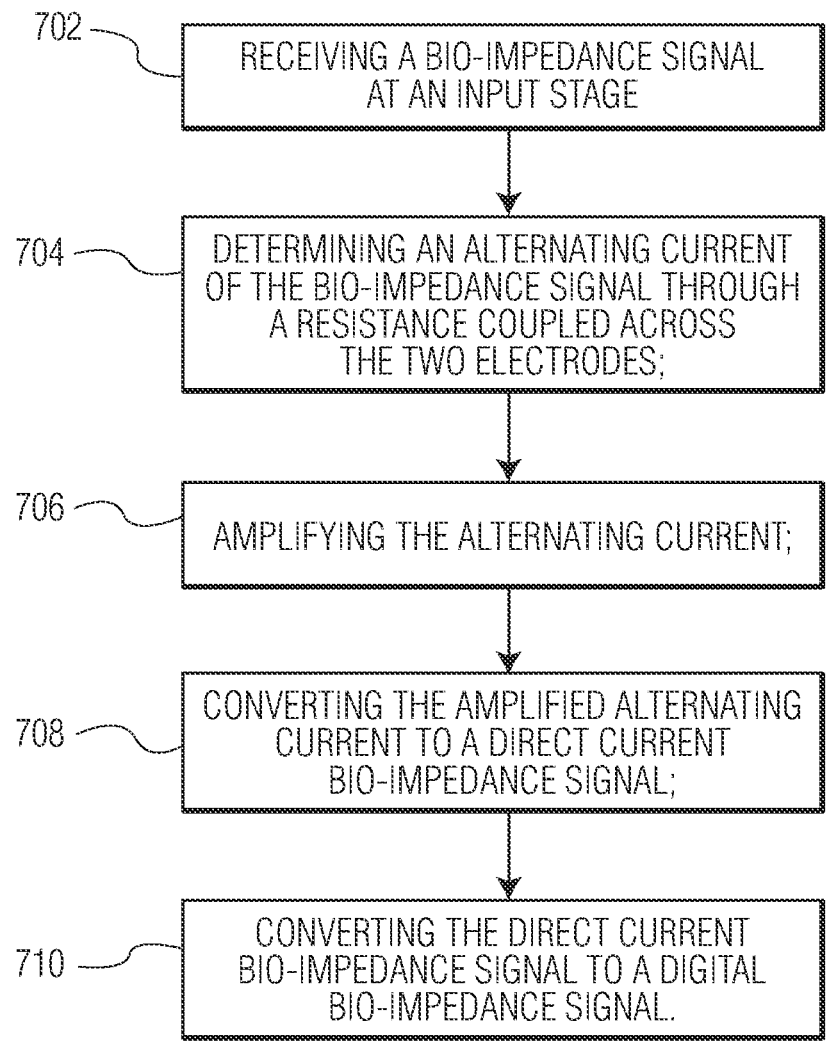
FIG. 7 is a process flow diagram of the operation of a bio-impedance sensor.

FIG. 7 is a process flow diagram of operations performed by the bio-impedance transducer described herein. Block 702 is receiving a bio-impedance signal at an input stage. The bio-impedance signal has an oscillating voltage from two electrodes. The electrodes are coupled to a body. Block 704 is determining an alternating current of the bio-impedance signal through a resistance coupled across the two electrodes.

Block 706 is amplifying the alternating current. Block 708 is converting the amplified alternating current to a direct current bio-impedance signal. Block 710 is converting the direct current bio-impedance signal to a digital bio-impedance signal.

Boundaries between the above-described operations are provided as examples. Multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program.

Alternatively, embodiments of the invention may be implemented entirely in hardware or in an implementation containing both hardware and software elements. In embodiments which use software, the software may include but is not limited to firmware, resident software, microcode, etc.

The connections as discussed herein may be any type of connection suitable to transfer signals or power from or to the respective nodes, units, or devices, including via intermediate devices. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, a plurality of connections may be replaced with a single connection that transfers multiple signals serially or in a time multiplexed manner. Likewise, single connections carrying multiple signals may be separated out into various different connections carrying subsets of these signals. The term "coupled" or similar language may include a direct physical connection or a connection through other intermediate components even when those intermediate components change the form of coupling from source to destination.

The described examples may be implemented on a single integrated circuit, for example in software in a digital signal processor (DSP) as part of a radio frequency integrated circuit (RFIC). The described examples may also be implemented in hardware in a field programmable gate array (FPGA) or application specific integrated circuit (ASIC), or in other electronic devices. The described examples may be implemented in analog circuitry, digital circuitry, or a combination of analog and digital circuitry. Alternatively, the circuit and/or component examples may be implemented as any number of separate integrated circuits or separate devices interconnected with each other in a suitable manner. These examples may alternatively be implemented as software or code representations of physical circuitry or of logical representations convertible into physical circuitry, such as in a hardware description language or any other appropriate form.

It will be readily understood that the components of the embodiments as generally described herein and illustrated in the appended figures may be arranged and designed in a wide variety of different configurations. Thus, the more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention may be practiced without one or more of the specific features or advantages of a particular embodiment. In other instances, additional features and advantages may be recognized in certain embodiments that may not be present in all embodiments of the invention.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A bio-impedance transducer comprising:
   an input stage configured to receive a bio-impedance signal having an oscillating voltage from two electrodes, the electrodes configured to be coupled to a body;
   a resistance across the two electrodes configured to determine an alternating current of the bio-impedance signal;
   a gain stage coupled to the resistance configured to amplify the alternating current;
   a down converter coupled to the gain stage configured to convert the amplified alternating current to a direct current bio-impedance signal; and
   an analog-to-digital converter coupled to the down converter configured to convert the direct current bio-impedance signal to a digital bio-impedance signal.

2. The bio-impedance transducer of claim 1, wherein the input stage comprises a source-follower circuit coupled to the electrodes at a first input and coupled to the resistance at a first output.

3. The bio-impedance transducer of claim 1, wherein the input stage comprises a feedback loop coupled across the electrodes and to the gain stage.

4. The bio-impedance transducer of claim 3, wherein the feedback loop includes a balanced operational transconductance amplifier.

5. The bio-impedance transducer of claim 3, wherein the feedback loop includes diode-connected transistors between the electrodes and the gain stage.

6. The bio-impedance transducer of claim 1, further comprising an excitation current source coupled to the electrodes configured to generate an alternating current excitation current to be injected into the body through the electrodes.

7. The bio-impedance transducer of claim 6, wherein the down converter comprises a mixer configured to mix the amplified alternating current with the excitation current.

8. The bio-impedance transducer of claim 7, wherein the analog-to-digital converter comprises a continuous time second order sigma delta analog-to-digital converter.

9. The bio-impedance transducer of claim 8, wherein the continuous time sigma delta analog-to-digital converter comprises a balanced operational transconductance amplifier coupled to the mixed amplified alternating current as an input and a capacitance coupled across the input and an output of the balanced operational transconductance amplifier.

10. The bio-impedance transducer of claim 1, wherein the gain stage comprises:
an in-phase gain stage coupled to the resistance configured to amplify an in-phase component of the alternating current; and
a quadrature phase gain stage coupled to the resistance configured to amplify a quadrature phase component of the alternating current.

11. The bio-impedance transducer of claim 10, wherein the down converter comprises:
an in-phase down converter coupled to the in-phase gain stage configured to convert the amplified in-phase component to a direct current in-phase bio-impedance signal; and
a quadrature phase down converter coupled to the quadrature phase gain stage configured to convert the amplified quadrature phase component to a direct current quadrature phase bio-impedance signal.

12. The bio-impedance transducer of claim 11, wherein the analog-to-digital converter comprises:
an in-phase analog-to-digital converter coupled to the in-phase gain stage configured to convert the direct current in-phase bio-impedance signal to a digital in-phase bio-impedance signal; and
a quadrature phase analog-to-digital converter coupled to the quadrature phase down converter configured to convert the direct current quadrature phase bio-impedance signal to a digital quadrature phase bio-impedance signal.

13. The bio-impedance transducer of claim 1, further comprising a current mirror coupled to the down converter configured to convert a differential current from the down converter to a single ended current to the analog-to-digital converter.

14. A method comprising:
receiving a bio-impedance signal, from two electrodes coupled to a human body, at an input stage, wherein the bio-impedance signal is an oscillating voltage;
determining an alternating current of the bio-impedance signal based upon a known resistance that is coupled across the two electrodes;
amplifying the alternating current using a gain stage circuit;
converting the amplified alternating current to a direct current bio-impedance signal using a down converter coupled to the gain stage circuit; and
converting the direct current bio-impedance signal to a digital bio-impedance signal using an analog-to-digital converter;
wherein the digital bio-impedance signal corresponds to a health parameter of the human body.

15. The method of claim 14, further comprising:
feeding back the amplified alternating current; and
amplifying the alternating current using a current mirror.

16. The method of claim 14, further comprising:
generating an alternating current excitation current from an excitation current source; and
injecting the excitation current into the body through the electrodes.

17. The method of claim 16,
wherein converting the amplified alternating current includes mixing the amplified alternating current with the excitation current.

18. A health monitor system comprising:
an input stage configured to receive a bio-impedance signal having an oscillating voltage from two electrodes, the electrodes configured to be coupled to a body;
a resistance across the two electrodes configured to determine an alternating current of the bio-impedance signal;
a gain stage coupled to the resistance configured to amplify the alternating current;
a down converter coupled to the gain stage configured to convert the amplified alternating current to a direct current bio-impedance signal;
an analog-to-digital converter coupled to the down converter configured to convert the direct current bio-impedance signal to a digital bio-impedance signal; and
a radio frequency system configured to send the digital bio-impedance signal to external components.

19. The health monitoring system of claim 18, wherein the input stage is based on a current balancing instrumentation amplifier such that the oscillating voltage from the electrodes appears on the resistance through a source follower input stage.

20. The health monitoring system of claim 18, wherein the input stage is coupled directly to the gain stage with no intermediate stage.

* * * * *